INVENTOR
CARROLL R. MINER
BY James and Franklin
ATTORNEY

INVENTOR
CARROLL R. MINER
BY James and Franklin
ATTORNEY

United States Patent Office 3,505,620

Patented Apr. 7, 1970

3,505,620

PRESETTABLE TELEVISION CHANNEL TUNER USING VARIABLE CAPACITOR AND VARIABLE CAPACITANCE DIODES

Carroll R. Miner, Wilbraham, Mass., assignor to General Instrument Corporation, Newark, N.J., a corporation of Delaware Filed Nov. 27, 1968, Ser. No. 779,406
Int. Cl. H03h *5/12;* H03i *5/00*
U.S. Cl. 334—15 12 Claims

ABSTRACT OF THE DISCLOSURE

A presettable TV tuner comprises a tuning circuit having a variable capacitor and a voltage-variable capacitor. The variable capacitor is operatively secured to a movable control member having a plurality of predetermined positions to which it can be moved to vary the capacitance value of the variable capacitor, and to apply a different preset capacitance-varying voltage to the voltage variable capacitor, thereby to select a different predetermined channel at each of the predetermined positions of the control member.

Figure 1:
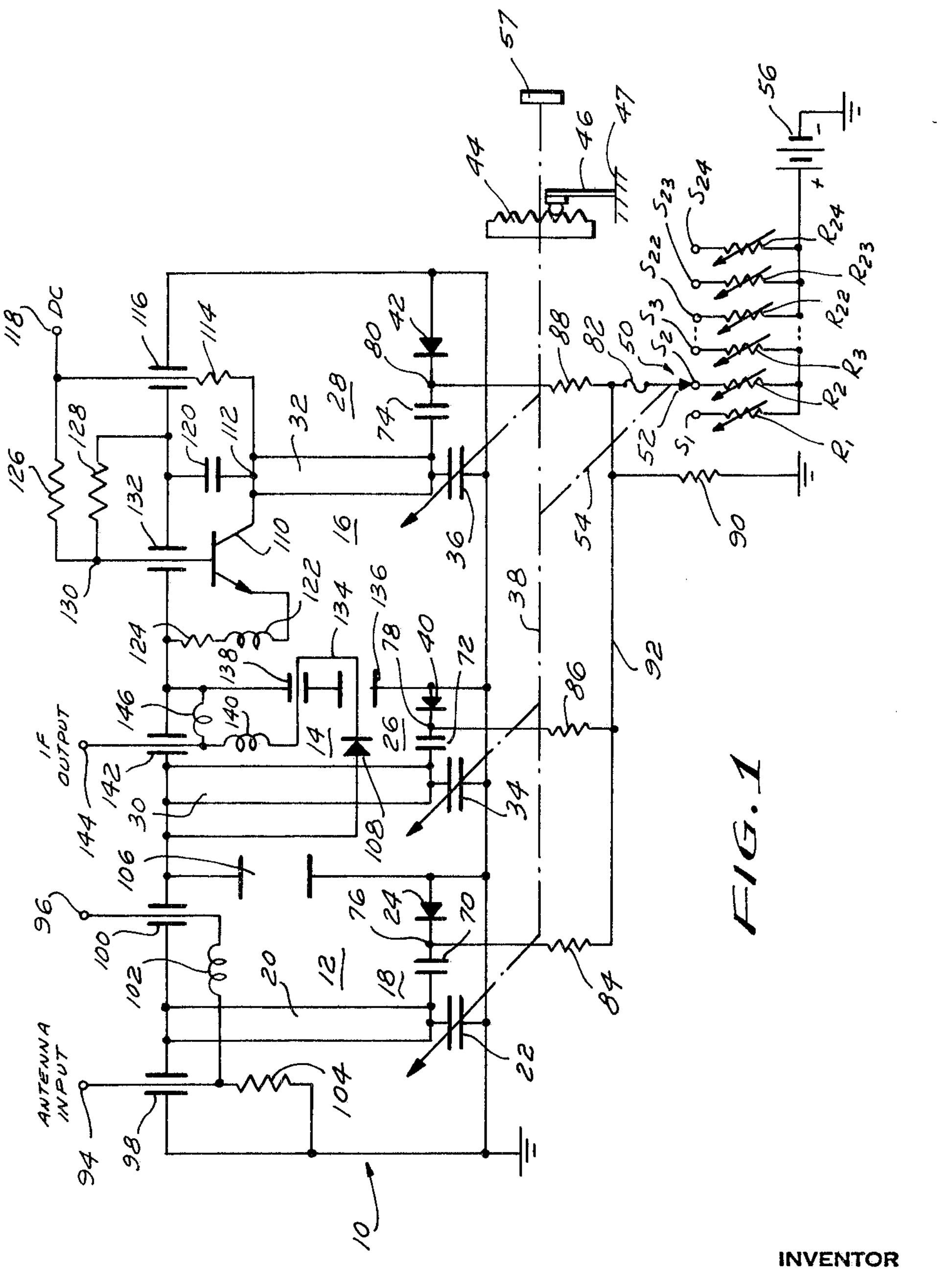

The present invention relates to tuners, and particularly to a television tuner capable of being tuned to one of a plurality of preselected channels. It has particular utility for tuning within the UHF television reception band, and it is here specifically described in that connection, but it is not limted thereto.

In recent years greater use has been made of channels within the UHF band for commercial and educational television broadcasting. Use of channels falling within this band has greatly increased the number of channels available for programming, and a large proportion of commercial television receivers that are presently being manufactured and sold are routinely provided with the capability of receiving channels within the UHF band as well as the VHF band. These TV receivers are generally provided with two separate tuners, one for tuning in the VHF band and another for tuning in the UHF band.

In conventional UHF tuners, tuning to the selected channel in the UHF band is effected in two discrete steps, first a coarse operation to select the desired frequency band or range, and then a fine tuning operation by means of which more precise tuning is achieved within that band to provide the optimum audio and video reception of a particular channel. The coarse tuning is effected by the provision of a connection, involving little or no gear reduction, between the control knob and a shaft carrying the tuning capacitors, after which fine tuning is effected by rotating the shaft at higher rotational speeds using a second knob mechanically coupled to the shaft with gear reduction of suitable magnitude. In other tuner constructions, a single tuning knob is employed in conjunction with mechanism effective to impart two distinct shaft rotational speeds for coarse and fine tuning, respectively, upon rotation of the knob first in one direction and then in the other. A dial or knob carrying the UHF channel identifying indicia is usually operatively connected to the shaft and provides a visual indication of the approximate channel to which the set is tuned for a given rotational position of the tuning knob. Coarse tuning is carried out until the operator receives a visual indication that he is approximately tuned to the desired channel. The operator then utilizes the fine tuning control more or less empirically, by inspection of the received image, until the optimum reception of the selected channel is achieved. The major disadvantages and limitations of the conventional UHF tuning arrangements are that the viewer is required to utilize great care whenever he wishes to tune to a channel in the UHF band and to change to a new channel. As described above, this channel selection must be performed in a time-consuming and tedious two-step operation which requires the viewer to first perform the initial coarse tuning and then to exercise careful, manual control of the fine tuning mechanism to bring the received image into its optimum condition.

Besides the inconvenience which the conventional tuners cause the viewer, these mechanisms are also bulky and require the use of mechanical gear reduction and similar components that are susceptible to wear and eventual failure after long periods of their use.

It is an object of the present invention to provide a television tuner in which tuning to a selected channel is simplified.

It is a further object of the present invention to provide a UHF tuner in which a plurality of selected channels within the UHF band may be preselected, and tuning to any of these preselected channels is accomplished quickly, easily, and reliably.

It is another object of this invention to provide a tuner of this type in which tuning to a selected channel is achieved in a one-step operation, and which minimizes the need for relatively complex and unreliable mechanical components.

It is yet a further object of the present invention to provide a TV tuner, particularly for tuning in the UHF range, in which the tuning circuit comprises voltage-variable capacitance diodes, and in which the fine tuning aspect of channel selection is achieved by applying a preselected tuning voltage to these diodes for each one of a preselected number of tuning channels, and in which the Q of the tuning circuit is at a sufficiently high level for good selectivity.

It is still another object of the present invention to provide a TV tuner having particular use in channel selection in the UHF band, in which the number of channels may be preselected, the viewer readily selecting any one of these preselected channels when desired.

To these ends, the present invention comprises a tuner in which the tuning circuit comprises a variable capacitor operatively connected to a movable control member and a voltage-variable capacitor electrically connected to that variable capacitor. A plurality of voltage sources preset to appropriate voltage values are provided. The control member is adapted to be moved into a selected one of a plurality of predetermined positions, the variable capacitor thus also being moved along with the control member to one of a plurality of predetermined positions corresponding to preselected tuned frequencies. Selecting means operatively connected to the control member and movable therewith is effective to connect a different voltage source to the voltage-variable capacitor for each of the predetermined positions of the control member.

The voltage-variable capacitor may be in the form of a voltage-variable capacitance diode having the characteristic of acting as a capacitance when a reverse bias signal is applied across its terminals, the magnitude of the capacitance of that diode being proportional to the magnitude of the reverse bias signal. Bias signals for such diodes are derived from the voltage sources which are operatively selected by the control members. Such voltage-variable capacitors have in the past been proposed for use in communication set tuners. However, the range over which their capacitance can be varied is relatively limited, and insufficient for tuning over all or even a major part of the UHF band. Hence one would be led to believe that such devices would not be useful for use in UHF tuners. However, by the combination of elements here involved, such devices are utilized, in conjunction with a more conventional tuning device such as a rotary variable condenser, to provide for pre-set channel selection over the entire UHF band.

The control member may be in the form of a rotatable shaft member detent-retained in its predetermined positions. The selecting means comprises a switch having a movable contact and a plurality of fixed contacts, one for each of the predetermined positions of the control member, and each of the fixed contacts is connected to a different voltage source. In this manner when the shaft is rotated to a different one of its predetermined positions, the movable contact engages a different one of its fixed contacts and is thus connected to a different voltage source; the movable contact is connected to the voltage variable capacitor in the tuning circuit. The plurality of voltage sources may preferably be in the form of a plurality of potentiometers each connected to a voltage supply, the wiper of each of the potentiometers being preset to produce at the output of each potentiometer a preselected voltage appropriate to establish a value of capacitance at the voltage variable capacitance diode which, when acting together with the capacitance of the variable capacitor at the corresponding position of the control member, will precisely and reliably tune the tuning circuit to a preselected channel which thus corresponds to the preset position of the control member. Thus the control member, in moving from one preselected position to another, accomplishes a gross change in capacitance in the tuning circuit (coarse tuning) by changing the capacitance of the variable capacitor, and at the same time accomplishes a precise but lesser change in the tuning circuit capacitance (fine tuning) by changing the capacitance of the voltage-variable capacitor. The gross change will condition the tuning circuit to tune within a given portion of the UHF band (e.g. a portion covering three channels); the lesser change will condition the tuning circuit to select the desired channel within that given portion of the band.

Figure 2:
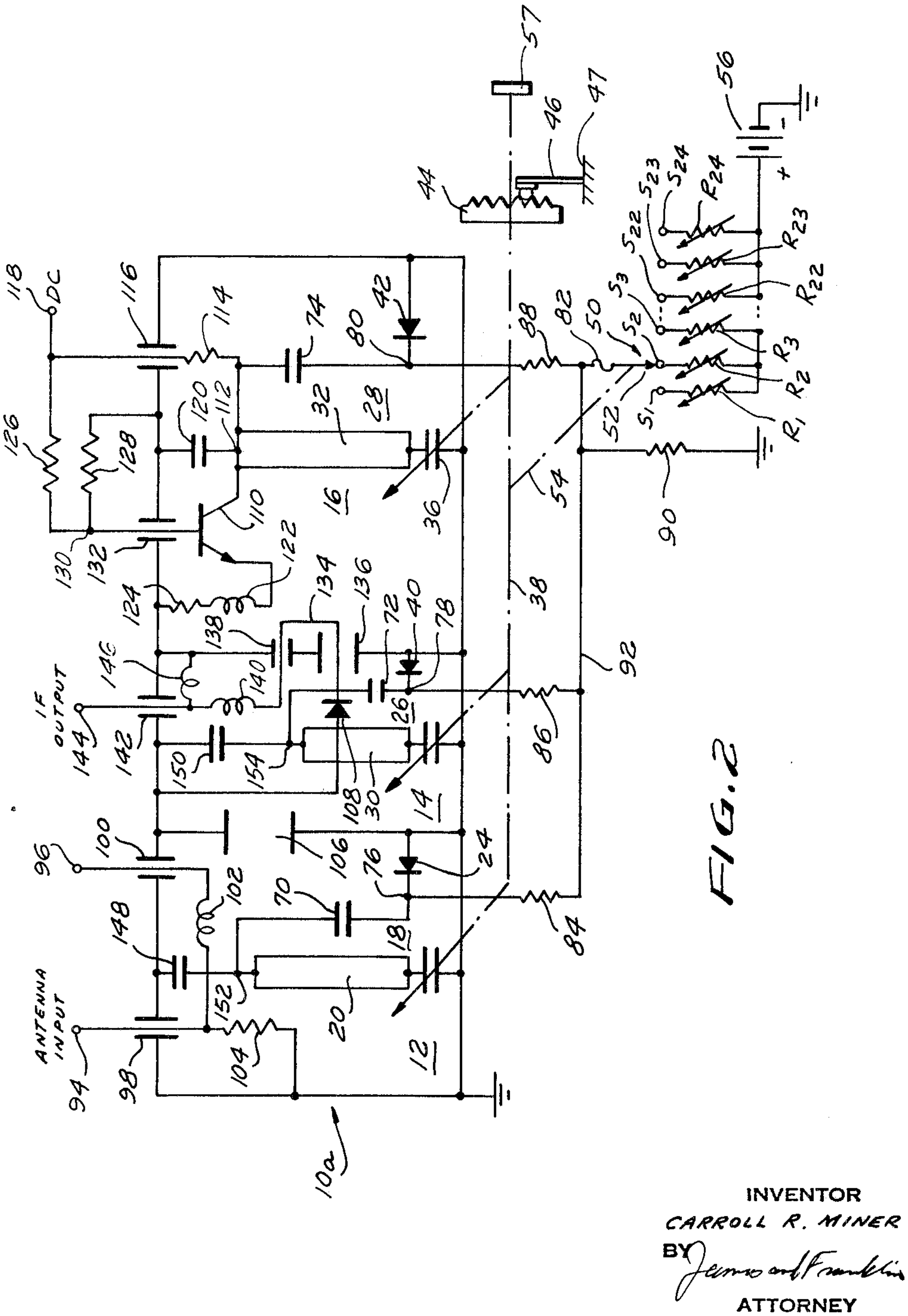

To the accomplishment of the above, and to such other objects as may hereinafter appear, the present invention relates to a presettable tuner, as defined in the accompanying claims and as described in this specification, taken together with the accompanying drawings in which:

FIG. 1 is a schematic circuit diagram of one embodiment of the tuner of the present invention; and FIG. 2 is a schematic circuit diagram of a second embodiment of a tuner having features of the present invention.

The tuner comprises a tuning circuit generally designated 10 which comprises an antenna or input circuit 12, a mixer circuit 14 and a local oscillator circuit 16, these being the three stages conventionally provided at the input of a radio frequency receiver. Each of these stages comprises an LC resonant tuning circuit capable of being tuned to a frequency within the R.F. band. For example, antenna circuit 12 comprises a tuning circuit 18 which comprises an inductance line 20 in resonant circuit arrangement with a tuning capacitance which is defined by a variable capacitor 22 and voltage-variable capacitance means in the form of a voltage variable capacitance diode 24. The voltage-variable capacitance diode 24 is a semiconductor device having the property of acting as a capacitance when a reverse bias voltage is applied across its terminals, the value of the capacitance of the diode being determined by the magnitude of the reverse bias voltage. Thus, to tune the tuning circuit 18 of antenna circuit 12, the capacitance values of the variable capacitor 22 and/or the voltage variable capacitance diode 24 are varied to establish, in conjunction with the inductance 20, the desired resonant frequency of the tuning circuit 18. The mixer 14 and local oscillator circuit 16 comprise similar tuning circuits 26 and 28 respectively, each of which comprises an inductance line 30 and 32 in resonant circuit arrangement with respective variable capacitors 34 and 36 and voltage-variable capacitance diodes 40 and 42. As is conventional, the three variable capacitors 22, 34 and 36 are secured or "ganged" to a movable control member in the form of a rotatable shaft schematically illustrated at 38, so that each of these capacitators is simultaneously varied upon the movement of the shaft 38.

In accord with the present invention, selecting means are provided, controlled by the rotation of shaft 38 to one of a plurality of predetermined positions, to apply an appropriate voltage across each of the variable capacitance diodes 24, 40 and 42 for each predetermined position of shaft 38. To control the movement of shaft 38 to its preset positions a detented wheel 44 is fast on shaft 38 and a detent follower 46 is resiliently mounted at 47 and engages the detents in wheel 44 in a manner effective to retain the shaft in one or another of its predetermined positions. The number of such predetermined positions is determined by the number of detents in wheel 44.

Selecting means in the form of a multi-contact switch 50 comprises a plurality of fixed switch contacts S1–S14. A movable switch arm 52 is operatively mechanically connected to shaft 38 by means of a mechanical linkage schematically shown at 54. Switch arm 52 is electrically operatively connected to one terminal of each of the voltage variable capacitance diodes 24, 40 and 42, the other terminal of these diodes each being connected to ground. A plurality of voltage source means, here shown as a plurality of potentiometers, R1–R24, each are connected to a voltage supply in the form of a battery 56, and the output terminal of each potentiometer is connected to one of the switch contacts S1–S24 respectively, of switch 50. The wiper arm of each of the potentiometers R1–R24 is preset to develop a preset voltage at the output terminals of the potentiometers. The number of potentiometers preferably equals the number of detents formed in wheel 44 and in the exemplary tuner as herein described, that number is twenty-four.

When the shaft 38 is at one of its predetermined positions, the movable switch arm 52 is in contact with one of the switch contacts S1–S24 and thus with the output of one of the potentiometers R1–R24. When shaft 38 is moved to another of its preset positions, such as by the manual operation of a knob 57, the switch arm 52, mechanically linked to shaft 38, moves into contact with another of the switch contacts S and thus with the output of another of the potentiometers R. Thus, for each of the predetermined positions of the shaft 38, a unique voltage will be applied across the voltage variable capacitance diodes 24, 40 and 42 in each of the input tuning circuits 12, 14 and 16, thereby to establish a specified value of capacitance for each of these diodes. Furthermore for each of the predetermined positions of shaft 38 each of the ganged variable capacitors 22, 34 and 36 of these tuning circuits will be moved to establish a predetermined value of capacitance. The capacitance variation derived from the capacitors 22, 34, 36 is greater than that derived from the voltage-variable diodes 24, 40, 42, the former thus producing what may be considered coarse tuning and the latter producing fine tuning. Thus, by a single movement of the shaft 38, variation is simultaneously effected in the capacitance value of both the movable and voltage-variable capacitances in each of the three input tuning circuits, thereby to simultaneously tune the circuits 12–16 with sufficient precision to select a given UHF channel for reception.

The variable capacitance diodes 24, 40 and 42 have an undesirable characteristic in that the Q of their effective capacitances is relatively low when their capacitance value is high. This feature of voltage variable capacitance diodes limits the use of these devices in tuning circuits in which high Q or high selectivity is required, and in which large variation in the capacity of these diodes is needed to tune over a wide tuning range. For this reason, in the circuit of FIG. 1, fixed or padding capacitors 70, 72 and 74 are respectively connected between the voltage variable capacitance diodes 24, 40 and 42 and the end of the inductance lines 20, 30 and 32 to which the variable ganged capacitors 22, 24 and 36 respectively are connected. The provision of these fixed capacitors in this manner is effective to isolate the variable capacitance diodes from their associated inductance lines and thus to reduce the loading effect of these capacitance diodes on the inductance lines and to prevent the relatively low Q of the variable capacitance diodes from seriously affecting the Q of the tuned circuits 12–16. The provision of the fixed capacitances 70–74 in series with the variable capacitance diodes 24, 40 and 42, reduces the resulting effective capacitance provided by the variable capacitance diodes in their respective tuning circuits. However, as will be seen, since fine tuning to the desired channel may be effected by a relatively small variation in the capacitance of these diodes and coarse tuning to a given portion of the UHF band has been accomplished by the variable capaictors 22, 34 and 36, this reduction in net capacitance can be tolerated in order to achieve the higher Q of the tuning circuits.

Each tuning circuit 12–16 may be considered as comprising an inductance (inductance lines 20, 30 and 32) in reasonant circuit configuration with a capacitor defined by a variable capacitor (22, 34 and 36) in shunt with the series combination of a voltage variable capacitance diode (24, 40 and 42) and a fixed padding capacitor (70, 72 and 74).

The movable switch arm 52 is connected to the terminals of the variable capacitance diodes 24, 40 and 42 at points 76, 78 and 80 respectively through a fuse 82 and current limiting resistors 84, 86 and 88 respectively. A voltage dropping resistor 90 is connected between ground and a line 92 common to resistors 84–88.

The input circuit 12 receives an R.F. signal from an external receiving antenna (not shown), that signal being applied to input circuit 12 at a pair of input leads 94 and 96 respectively passing through a pair of feedthrough capacitors 98 and 100 provided in the conductive housing (not shown) of tuner 10. A coil 102 is connected between leads 94 and 96 and is effective to inductively couple the input R.F. signal to inductance line 20. Lead 94 is connected to ground through a resistor 104.

The tuned R.F. frequency output of circuit 12 is magnetically coupled to inductance line 30 and to one terminal of a mixing diode 108 in mixer circuit 14 through a coupling window 106, which may be formed in a wall of the tuner housing provided between the input circuit 12 and the mixer circuit.

The local oscillator stage 16 comprises a transistor 110 having its collector tied to one end of the inductance line 32 at point 112, the latter being connected through a resistor 114 and a feedthrough capacitance 116 to a source 118 of positive D.C. potential. Point 112 is A.C. coupled to ground through an A.C. bypass capacitor 120. The emitter of transistor 110 is connected to ground through an inductance 122 in series with a resistor 124. This provides phase shift between the collector and emitter circuits of transistor 110 which permits the sustaining of oscillations at circuit 16 at the selected local oscillator frequency. A suitable bias level is established at the base of transistor 110 by means of a voltage divider comprising resistors 126 and 128 connected between potential source 118 and ground. Point 130, located between resistors 126 and 128 is connected to the base of transistor 110 through a feedthrough capacitor 132.

The local oscillator signal is inductively coupled from inductance line 32 to a lead 134 extending from mixer circuit 14 through feedthrough capacitors 136 and 138 into the region of tuner 10 comprising the circuit elements of local oscillator circuit 16. The local oscillator signal is applied to mixing diode 108 which is effective to produce an I.F. signal, as is conventional. That I.F. signal is connected through a choke coil 140 which filters out any R.F. components, and through a feedthrough capacitor 142 to an I.F. output port at 144. A coil 146 is connected between choke coil 140 and ground to provide a return path for the mixer diode 108.

The tuner circuit **10*a* illustrated in FIG. 2 is substantially similar to that illustrated in FIG. 1, and corresponding elements in the FIG. 2 circuit are identified by the same reference numerals used in FIG. 1. In the FIG. 2 circuit, the previously directly grounded ends of inductance lines 20 and 30 are now lifted from ground by virtue of their being respectively connected to ground through A.C. bypass capacitors 148 and 150 respectively. Padding capacitors 70 and 72, instead of being connected to these inductance lines at their point of connection with variable capacitors 24 and 34 respectively, as in the embodiment of FIG. 1, are now respectively connected to points 152 and 154 at the respective junctions between capacitors 148 and 150 and inductance lines 20 and 30, the other ends of capacitors 148 and 150 being grounded. This arrangement is somewhat superior to the one of the FIG. 1 circuit in that the addition of stray minimum capacity at the high impedance end of the lines 20 and 30 is avoided and the relatively low Q's of the voltage-variable capacitance diodes 24 and 40 have a reduced loading effect on these lines. As a result, the overall Q of tuning circuits 18 and 26** is increased.

In operation of the tuner of this invention, the viewer selects any desired number of channels up to the number of preset positions of shaft 38, which in the particular embodiment herein disclosed is twenty-four. These preselected channels would be the ones the viewer would most likely wish to tune during the foreseeable future.

In the UHF band, in which the tuner of this invention is most readily utilized, there are presently 70 available channels. For each of the twenty-four predetermined positions of shaft 38 and the variable capacitors 22, 34 and 36, the tuner is capable of being tuned to a portion of the UHF band containing approximately three channels and then by the further tuning of the voltage-variable capacitance diodes 24, 40 and 42, a particular channel within that band portion may be selected. The viewer is thus able, by means of the tuner of this invention, to preselect one of three channels for each band portion covered by the twenty-four predetermined positions of shaft 38. It will be noted that only a relatively small variation in the capacity of the variable capacitance diodes is required to tune to the selected channel within a given band portion selected by the ganged variable capacitors. As a result, there is no need to bias these diodes for high capacitance and thus low Q operation. That channel preselection is achieved by initially setting the voltage outputs of each of the potentiometers R1–R24. When a selected channel for a particular shaft position is optimally received by varying the position of the wiper arm of the potentiometer R operatively connected to the voltage-variable capacitance diodes for a given shaft position, that potentiometer is then locked by suitable means so that at any subsequent time, that channel can be reselected merely by placing the shaft 38 into that one of its positions. Thus, the ganged capacitors 22, 34 and 36, rotated to their preset positions along with the shaft 38, coarsely select a frequency within a relatively wide band, and fine tuning within that band to select the desired channel therein is achieved by tuning the variable capacitance diodes 24, 40 and 42, these two tuning operations being simultaneously performed by a single mechanical operation, i.e. the rotating of shaft 38 to one of its detent-controlled predetermined positions.

The number of detent-controlled preset shaft positions and the corresponding number of switch contacts and potentiometers may be chosen to meet viewing requirements. If more viewing channels are desired, that number may be readily increased. For example, to tune to each of the 70 channels now available in the UHF band, there would be a corresponding number (70) of potentiometers and detents.

The tuner of the present invention has the ability of tuning to a preselected channel such as in the UHF band by the performance of a single manually controlled operation. No longer must the viewer perform the time-consuming and tedious tasks of initial coarse tuning followed by fine tuning to achieve optimum reception. The number of mechanical components in the tuner, and particularly those conventionally provided for fine tuning, have been eliminated. Accordingly, the present tuner is less bulky, less complex and less susceptible to failure.

While only two embodiments of this invention have been herein specifically disclosed, it will be apparent that variations may be made thereto without departing from the spirit and scope of the invention:

I claim:

1. A presettable tuner comprising a tuning circuit including a variable capacitor and voltage-variable capacitance means connected to one another, a movable control member, said variable capacitor being operatively connected to said control member so as to be varied as said member is moved, said control member being adapted to be positioned in a selected one of a plurality of predetermined positions, a plurality of voltage source means, and selecting means operatively connected to said control member and effective to operatively connect a predetermined one of said source means to said voltage-variable capacitance means for each of said predetermined positions of said control member respectively.

2. The tuner of claim 1, said tuning circuit further comprising inductance means in resonant circuit arrangement with said variable capacitor and said voltage-variable capacitance means, and a fixed capacitor operatively connected to said voltage variable capacitance means and said inductance means.

3. The tuner of claim 1, said tuning circuit further comprising inductance means in resonant circuit arrangement with said variable capacitor and said voltage-variable capacitance means, bypass capacitor means operatively connected between one end of said inductance means and ground, and coupling capacitance means operatively connected between said voltage-variable capacitance means and said one end of said inductance means.

4. The tuner of claim 1, in which said selecting means comprises switch means having a plurality of switch positions each respectively operatively connected to one of said plurality of source means, the number of said switch positions corresponding to the number of said predetermined positions.

5. The tuner of claim 4, said tuning circuit further comprising inductance means in resonant circuit arrangement with said variable capacitor and said voltage-variable capacitance means, and a fixed capacitor operatively connected to said voltage variable capacitance means and said inductance means.

6. The tuner of claim 4, said tuning circuit further comprising inductance means in resonant circuit arrangement with said variable capacitor and said voltage-variable capacitance means, bypass capacitor means operatively connected between one end of said inductance means and ground, and coupling capacitance means operatively connected between said voltage-variable capacitance means and said one end of said inductance means.

7. The tuner of claim 4, in which said source means comprises a voltage supply and a plurality of potentiometers operatively connected to said voltage supply.

8. The tuner of claim 7, said tuning circuit further comprising inductance means in resonant circuit arrangement with said variable capacitor and said voltage-variable capacitance means, and a fixed capacitor operatively connected to said voltage variable capacitance means and said inductance means.

9. The tuner of claim 7, said tuning circuit further comprising inductance means in resonant circuit arrangement with said variable capacitor and said voltage-variable capacitance means, bypass capacitor means operatively connected between one end of said inductance means and ground, and coupling capacitance means operatively connected between said voltage-variable capacitance means and said one end of said inductance means.

10. The tuner of claim 1, in which said source means comprises a voltage supply and a plurality of potentiometers operatively connected to said voltage supply.

11. The tuner of claim 10, said tuning circuit further comprising inductance means in resonant circuit arrangement with said variable capacitor and said voltage variable capacitance means, and a fixed capacitor operatively connected to said voltage variable capacitance means and said inductance means.

12. The tuner of claim 10, said tuning circuit further comprising inductance means in resonant circuit arrangement with said variable capacitor and said voltage-variable capacitance means, bypass capacitor means operatively connected between one end of said inductance means and ground, and coupling capacitance means operatively connected between said voltage-variable capacitance means and said one end of said inductance means.

References Cited

UNITED STATES PATENTS

| | | | |
|---|---|---|---|
| 2,122,183 | 6/1938 | Schwarzer | 334—55 |
| 3,353,126 | 11/1967 | Schucht | 334—78 |

HERMAN KARL SAALBACH, Primary Examiner

PAUL L. GENSLER, Assistant Examiner

U.S. Cl. X.R.

325—422, 459; 331—177; 334—55, 83